(12) United States Patent
Yoshida et al.

(10) Patent No.: US 7,006,545 B2
(45) Date of Patent: Feb. 28, 2006

(54) SEMICONDUCTOR LASER DEVICE AND OPTICAL FIBER AMPLIFIER USING THE SAME

(75) Inventors: Junji Yoshida, Tokyo (JP); Naoki Tsukiji, Tokyo (JP); Tsuyoshi Saito, Tokyo (JP); Satoshi Irino, Tokyo (JP); Ryuichiro Minato, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 464 days.

(21) Appl. No.: 09/877,952

(22) Filed: Jun. 8, 2001

(65) Prior Publication Data

US 2002/0041613 A1 Apr. 11, 2002

(30) Foreign Application Priority Data

Oct. 2, 2000 (JP) ........................ 2000-302956

(51) Int. Cl.
*H01S 5/00* (2006.01)

(52) U.S. Cl. .............................. 372/46; 372/43; 372/44; 372/45

(58) Field of Classification Search .................. 372/46, 372/44, 45
See application file for complete search history.

(56) References Cited

U.S. PATENT DOCUMENTS

| 4,616,898 A | 10/1986 | Hicks, Jr. ................. 350/96.15 |
| 4,881,235 A | 11/1989 | Chinone et al. .............. 372/45 |
| 4,961,197 A | 10/1990 | Tanaka et al. | |
| 5,189,679 A | * | 2/1993 | Derry et al. .................. 372/45 |
| 5,305,336 A | 4/1994 | Adar et al. .................... 372/18 |

(Continued)

FOREIGN PATENT DOCUMENTS

| EP | 0 403 153 A2 | 12/1990 |
| EP | 0 500 962 A1 | 9/1992 |

(Continued)

OTHER PUBLICATIONS

Tanaka, et al, "Uniform P–Type Impurity–Doped Multi-quantum well AlGaInP Seminconductor Lasers with a Lasing Wavelength of 6e3 nm at 20° C," Applied Physics Letters, vol. 59, No. 16, pp. 1943–1945, Oct. 14, 1991.

(Continued)

*Primary Examiner*—Minsun Oh Harvey
*Assistant Examiner*—Dung T. Nguyen
(74) *Attorney, Agent, or Firm*—Sheppard Mullin Richter & Hampton LLP

(57) ABSTRACT

A semiconductor laser device with an active layer having a multi-quantum well structure including more than one well layer and more than one barrier layer and having a cavity length of more than 800 μm is disclosed, wherein the active layer includes a doped region which includes at least one well layer and at least one barrier layer adjacent to the well layer. The entire active region, comprising all of the well and active layers may be doped. Adjacent to the active layer are upper and lower optical confinement layers falls having a thickness within a range of from about 20 to about 50 nm. A optical fiber amplifier incorporating the semiconductor laser is also disclosed, including the semiconductor laser device sealed within a package disposed over a cooler, and wherein a light incidence facet of an optical fiber is optically coupled to the optical output power facet of the semiconductor laser device.

18 Claims, 7 Drawing Sheets

U.S. PATENT DOCUMENTS

| | | | | |
|---|---|---|---|---|
| 5,506,859 | A | * 4/1996 | Ackerman et al. | 372/45 |
| 5,557,627 | A | * 9/1996 | Schneider et al. | 372/45 |
| 5,563,732 | A | 10/1996 | Erdogan et al. | 359/341 |
| 5,666,375 | A | * 9/1997 | Yokouchi et al. | 372/45 |
| 5,699,377 | A | 12/1997 | Pan | 372/92 |
| 5,721,636 | A | 2/1998 | Erdogan et al. | 359/341 |
| 5,724,377 | A | 3/1998 | Huang | 372/22 |
| 5,801,403 | A | 9/1998 | He | 257/94 |
| 5,845,030 | A | 12/1998 | Sasaki et al. | 385/88 |
| 5,870,417 | A | * 2/1999 | Verdiell et al. | 372/32 |
| 5,889,805 | A | * 3/1999 | Botez et al. | 372/45 |
| 5,936,763 | A | 8/1999 | Mitsuda et al. | 359/341 |
| 5,936,994 | A | * 8/1999 | Hong et al. | 372/96 |
| 5,949,807 | A | * 9/1999 | Fujimoto et al. | 372/45 |
| 5,960,019 | A | 9/1999 | Hayashi et al. | 372/46 |
| 5,978,401 | A | 11/1999 | Morgan | 372/50 |
| 5,995,525 | A | 11/1999 | Kosugi | 372/36 |
| 5,995,692 | A | 11/1999 | Hamakawa et al. | 385/49 |
| 6,026,110 | A | * 2/2000 | Makino | 372/96 |
| 6,108,360 | A | * 8/2000 | Razeghi | 372/45 |
| 6,160,829 | A | * 12/2000 | Sawano | 372/44 |
| 6,238,947 | B1 | * 5/2001 | Shakuda | 257/46 |
| 6,240,114 | B1 | 5/2001 | Anselm et al. | |
| 6,288,410 | B1 | * 9/2001 | Miyazawa | 257/14 |
| 6,396,861 | B1 | * 5/2002 | Shimizu et al. | 372/45 |
| 6,400,742 | B1 | * 6/2002 | Hatakoshi et al. | 372/45 |
| 6,490,303 | B1 | * 12/2002 | Komiyama et al. | 372/43 |
| 6,563,852 | B1 | * 5/2003 | Baillargeon et al. | 372/45 |
| 2001/0048702 | A1 | * 12/2001 | Yoshida et al. | 372/43 |
| 2002/0008242 | A1 | * 1/2002 | Hata | 257/79 |

FOREIGN PATENT DOCUMENTS

| | | |
|---|---|---|
| EP | 800243 A2 | 10/1997 |
| EP | 0812040 A | 12/1997 |
| JP | 62-276892 A | 12/1987 |
| JP | 02-078290 | 3/1990 |
| JP | 03-049281 A | 3/1991 |
| JP | 04-343492 A | 11/1992 |
| JP | 05-136511 A | 6/1993 |
| JP | 05-206579 A | 8/1993 |
| JP | 05-206580 A | 8/1993 |
| JP | 5-315705 A | 11/1993 |
| JP | 05-327031 A | 12/1993 |
| JP | 07-099373 A | 4/1995 |
| JP | 07-333470 A | 12/1995 |
| JP | 8-201609 A | 8/1996 |
| JP | 08-330671 A | 12/1996 |
| JP | 09-083059 A | 3/1997 |
| JP | 09-083070 A | 3/1997 |
| JP | 09-219475 A | 8/1997 |
| JP | 09-260766 A | 10/1997 |
| JP | 09-269439 A | 10/1997 |
| JP | 09-275240 A | 10/1997 |
| JP | 9-283847 A | 10/1997 |
| JP | 09-298319 A | 11/1997 |
| JP | 10-062654 A | 3/1998 |
| JP | 10-154847 A | 6/1998 |
| JP | 11-017248 A | 1/1999 |
| JP | 11243249 A | * 9/1999 |
| WO | WO-00/42685 | 7/2000 |

OTHER PUBLICATIONS

Ralston, et al, "p–Dopant Incorporation and Influence on Gain and Damping Behaviour in High–Speed GaAs–based strain MQW Lasers," Material Science and Engineering, vol. B21, Nos. 2/3, pp. 232–236, Nov. 20, 1993.

Tanaka, et al, "Frequency Control of Self–Sustained Pulsating Laser Diodes by Uniform Impurity Doping into Multiple–Quantum–Well Structures," IEEE Photonics Technology Letters, vol. 10, No. 1, Jan. 1998.

G. P. Agrawal, "Longitudinal–Mode Stabilization in Semiconductor Lasers with Wavelength–Selective Feedback," Journal of Applied Physics, vol. 59, No. 12, Jun. 15, 1986, pp. 3958–3961.

S. Oshiba, et al., "High–Power Output Over 200mW of 1.3 $\mu$m GalnAsP VIPS Lasers," IEEE Journal of Quantum Electronics, vol. QE–23, No. 6, Jun. 1987, pp. 738–743.

Toshio Nonaka, "Pumping Sources for Optical Fiber Amplifiers," Optronics, (published by The Optronics Co., Ltd.), No. 107, Nov. 1990, pp. 59–66. (In Japanese, English–Language Abstract on last page).

Asano, et al., "1.48$\mu$m High–Power InGaAs/InGaAsP MQW LD's for Er–Doped Fiber Amplifiers," IEEE Photonics Technology Letters, vol. 3, No. 5, May 1991, pp. 415–417.

Ikuo Mito and Kenji Endo, "1.48 $\mu$m and 0.98 $\mu$m High Power Laser diodes for Erbium–Doped Fiber Amplifiers," *Optical amplifiers and their applications*, summaries of papers presented at the Optical Amplifiers and Their Applications Topical Meeting, Jul. 24–26, 1991, Snowmass Village, Colorado, cosponsored by IEEE/Lasers and Electro–optics Society and the Optical Society of America, Technical digest series. 1991, v. 13, pp. 22–25.

T. Higashi, et al., "Optimum Asymmetric Mirror Facets Structure for High Efficiency Semiconductor Lasers," 13th IEEE International Semiconductor Laser Conference, Sep. 1992, Takamatsu Japan, pp. 46–47.

C. R. Giles, et al., "Simultaneous Wavelength–Stabilization of 980–nm Pump Lasers," *Optical amplifiers and their applications*, summaries of papers presented at the Optical Amplifiers and Their Applications Topical Meeting, Jun. 4–6, 1993, Yokohama, Japan, cosponsored by Optical Society of America and the IEEE Lasers and Electro–Optics Society, pp. 380–383.

A. Kasukawa, et al., "Extremely High Power 1.48 $\mu$m GalnAsP/InP Grin–Sch Strained MQW Lasers," IEEE Photonics Technology Letters, vol. 6 : No. 1, Jan., 1994, pp. 4–6.

M. Shigehara, et al., "Single Longitudinal Mode Laser Diode using Fiber Bragg Grating," Proceedings of the 1995 of the IEICE General Conference (The Institute of Electronics, Information and Communications Engineers), Mar. 27, 1995, p. 380 (In Japanese, English–language translation attached).

T. Wakami, et al., "0.98 $\mu$m Laser Diode with Fiber Bragg Gratings," Proceedings of the 1995 Electronics Society Conference of IEICE (The Institute of Electronics, Information and Communications Engineers), Sep. 5, 1995, p. 156 (In Japanese, Partial English–language translation attached).

R. J. Campbell, et al., "A Wavelength Stable Uncooled Laser for Access Networks," Proceedings of the 21st European Conference on Optical Communications (ECOC'95), Brussels, Belgium, Sep. 17–21, 1995, pp. 545–548.

Don Hargreaves, et al., "High–power 980–nm Pump Module Operating Without a Thermoelectric Cooler," 1996 Technical Digest Series (Conference Edition) of the Optical Fiber Communication 1996 ("OFC '96"), Optical Society of America, Feb. 25, 1996 (San Jose California), pp. 229–230.

J. Piprek, et al., "Cavity Length Effects on Internal Loss and Quantum Efficiency of Multiquantum–Well Lasers," IEEE Journal of Selected Topics in Quantum Electronics, vol. 5, No. 3, May/Jun. 1999, pp. 643–647 (UCSB).

Akihiko Kasukawa, Tomokazu Mukaihara, Takeharu Yamaguchi, Jun'jiro Kikawa, "Recent Progress of High Power Semiconductor Lasers for EDFA Pumping," Furukawa Review, No. 19, Apr. 2000, pp. 23–28.

Akihiko Kasukawa, Tomokazu Mukaihara, Takeharu Yamaguchi, Jun'jiro Kikawa, "Recent Progress in High–Power Semiconductor Lasers for Pumping of Optical Fiber Amplifiers," Furukawa Electric Review, No. 105, Jan. 2000, pp. 13–18. (In Japanese).

Toshio Kimura, Naoki Tsukiji, Junji Yoshida, Naoki Kimura, Takeshi Aikiyo, Tetsuro Ijichi, and Yoshikazu Ikegami, "1480–nm Laser Diode Module with 250–mW Output for Optical Amplifiers (Fol 1404QQ Series)," Furukawa Review, No. 19, Apr. 2000, pp. 29–33.

Toshio Kimura, Naoki Tsukiji, Junji Yoshida, Naoki Kimura, Takeshi Aikiyo, Tetsuro Ijichi, and Yoshikazu Ikegami, "250 mW—1480 nm Laser Diode Module for Optical Amplifiers (Fol 1404QQ Series)," Furukawa Electric Review, No. 105, Jan. 2000, pp. 19–23. (In Japanese).

Akira Mugino and Yuichiro Irie, "Output Power Optimization in 980–nm Pumping Lasers Wavelength–Locked Using Fiber Bragg Gratings," Furukawa Review, No. 19, Apr. 2000, pp. 41–46.

Akira Mugino and Yuichiro Irie, "Output Power Optimization of 980–nm Pumping Lasers Wavelength–Locked Using Fiber Bragg Gratings," Furukawa Electric Review, No. 105, Jan. 2000, pp. 24–29. (In Japanese).

Yoshihiro Emori and Shu Namiki, "Demonstration of Broadband Raman Amplifiers: a Promising Application of High–power Pumping Unit," Furukawa Review, No. 19, Apr. 2000, pp. 59–62.

Yoshihiro Emori and Shu Namiki, "Demonstration of Broadband Raman Amplifiers as a Promising Application of High–power Pumping Unit," Furukawa Electric Review, No. 105, Jan. 2000, pp. 42–45. (In Japanese).

Osamu Aso, Masateru Tadakuma, Shu Namiki, "Four–Wave Mixing in Optical Fibers and Its Applications," Furukawa Review, No. 19, Apr. 2000, pp. 63–68.

Osamu Aso, Masateru Tadakuma, Shu Namiki, "Four–Wave Mixing in Optical Fibers and Its Applications," Furukawa Electric Review, No. 105, Jan. 2000, pp. 46–51. (In Japanese).

Hitoshi Shimizu, Kouji Kumada, Nobumitsu Yamanaka, Norihiro Iwai, Tomokazu Mukaihara, and Akihiko Kasukawa, "Extremely Low threshold 1.3$\mu$m InAsP n–Type Modulation Doped MQW Lasers," Furukawa Review, No. 19, Apr. 2000, pp. 149–154.

Hitoshi Shimizu, Kouji Kumada, Nobumitsu Yamanaka, Norihiro Iwai, Tomokazu Mukaihara, and Akihiko Kasukawa, "Extremely Low threshold 1.3$\mu$m InAsP n–Type Modulation Doped MQW Lasers," Furukawa Electric Review, No. 104, Jul. 1999, pp. 48–52. (In Japanese).

P. Gavrilovic, et al., "CW High Power Single Lobed Far–Field Operation of Long Cavity AlGaAs–GaAs Single Quantum–Well Laser Diodes Grown by MOCVD," IEEE Journal of Quantum Electronics, vol. 27, No. 7, Jul., 1991, pp. 1859–1862.

H. Yamazaki, et al., "Over Half–Wall Output Power 1.48–$\mu$m Wavelength EDFA Pumping ASM LD's," Optical Fiber Communication Conference and Exhibit 2000 (OFC'2000), Baltimore, Maryland, Mar. 9, 2000, pps. 165–167.

Kasukawa, et al., "High Power Semiconductor Lasers for Optical Fiber Amplifiers," Technical report of the Institute of Electronics, Information and Communication Engineers (IEICE), vol. 96, No. 188, Jul. 1996, pp. 23–30. (In Japanese, English–Language Abstract).

Prosyk, et al., "Well Number, Length, and Temperature Dependence of Efficiency and Loss in InGaAsP–InP Compressively Strained MQW Ridge Waveguide Lasers at 1.3 $\mu$m," IEEE Journal of Quantum Electronics, vol. 33, No. 8, Aug. 1997.

Hamakawa, et al., "Wavelength Stabilization of 1.48 $\mu$m Pump Laser by Fiber Grating," 22–nd European Conference on Optical Communication—ECOC '96, Oslo, 1996, vol. 1, pp. 119–122.

* cited by examiner

SEMICONDUCTOR LASER DEVICE AND OPTICAL FIBER AMPLIFIER USING THE SAME

FIELD OF THE INVENTION

The present invention relates generally to semiconductor laser devices of the type having an active layer (light emitting region) with a multiple quantum well ("MQW") structure. More particularly, this invention relates to MQW semiconductor laser devices with higher carrier injection efficiency and enhanced light output. The invention also relates to optical fiber amplifiers employing the same.

BACKGROUND OF THE INVENTION

Semiconductor laser devices having an active layer (light emitting region) employing a multiple quantum well structure are known in the art. Such devices emit light at lower threshold currents than semiconductor laser devices having a bulk active layer, and have a higher optical output power.

An example of a known MQW laser device is shown in cross-section in FIG. 1a. The laser device depicted in FIG. 1a comprises a number of semiconductor layers which are formed using known techniques on a semiconductor substrate 1, which in the example depicted is an n-type semiconductor. The various layers include: an n-type lower cladding layer 2A, an undoped lower optical confinement layer 3A, an active layer 4, an undoped upper optical confinement layer 3B, a p-type upper cladding layer 2B, and a p-type cap layer 5. These layers are sequentially formed on the substrate 1 by any of a number of known epitaxial crystal growth techniques such as, for example, metal organic chemical vapor deposition (MOCVD). An n-type lower electrode 6A is also formed on the lower side of substrate 1 and a p-type upper electrode 6B is formed over cap layer 5. As depicted in FIG. 1a, active layer 4 and the adjacent optical confinement layers 3A and 3B are formed into an elongated mesa structure using standard photolithographic techniques. Current blocking p-type semiconductor layer 7A and n-type semiconductor layer 7B are then formed in the region adjacent to the mesa structure, so that, in operation, current is injected into active layer 4 in a narrow area.

The resulting structure is then cleaved to provide a laser having a predetermined cavity length (L), with a front facet (S1), used for light emission, formed on one cleaved plane and a rear facet (S2) formed on the opposite cleaved plane. The front facet S1 has an antireflective coating to facilitate light emission from the front surface of the cavity and the rear facet has a highly reflective coating to suppress light emission from the rear surface.

It is known that the active layer 4 may be designed to have a MQW structure consisting essentially of alternate heterojunctions of well layers made of semiconductor material. Each hetero-junction comprises a pair of semiconductor layers: a well layer of a narrow band gap energy and a barrier layer. The barrier layer has a band gap energy which is wider than that of the well layers. Each of the various sub-layers in the MQW structure has a thickness of several nanometers.

Lower and upper optical confinement layers 3A and 3B adjacent to active layer 4 are each designed to have a separate confinement heterostructure (SCH), in order to enhance the confinement of the laser light generated in active layer 4, thereby enhancing the external differential quantum efficiency of the laser to achieve high optical output power operation.

It is also known in the art that the semiconductor laser device of FIG. 1a may be mounted in a package to form a laser module which is suitable for use as a signal light source in an optical communications system, or as a light source for pumping an optical fiber amplifier such as an erbium-doped fiber amplifier (EDFA) or a Raman amplifier. Within the package, the laser device may be thermally coupled to a cooling device comprising Peltier elements. The package may also include any other known elements to monitor and control heat generation and optical output, and to ensure good optical coupling of the laser output to an optical fiber.

In recent years, the rapid growth in the Internet and other communications systems has led to the development of fiber-optic wavelength division multiplexing (WDM) system architectures to provide increased data transmission capacity in such systems. In order to provide optical fiber amplifiers with enhanced optical output performance to meet the demand for an increased number of channels, there has been a need for pumping lasers with high optical output coupled to the optical fiber. Pumping lasers for optical fiber amplifiers are required to offer stable operation with ever higher fiber-coupled optical output and with narrower spectral width, especially for use in optical fiber Raman amplifiers.

One way to achieve a high optical output pumping laser with an MQW active layer is to increase the cavity length (L). Increasing the cavity length decreases both the electric resistance and thermal impedance of the laser device. This results in a larger saturation driving current $I_{sat}$ at which the maximum optical output power occurs, since the saturation is dominated by thermal saturation effects. However, for a given value of output facet reflectivity, increasing L causes the external differential quantum efficiency to lower, as depicted in FIG. 1b. As can be seen in FIG. 1b, the power versus current slope is initially lower for long cavity lasers. Thus, it can be disadvantageous to use a long cavity laser for high optical output power operation at certain driving currents, because the external differential quantum efficiency decreases as the cavity length increases.

This problem can be ameliorated to some degree by reducing the reflectivity of the output facet. However, lowering the reflectivity of the output facet of the laser device below a certain value results in a decrease of the differential quantum efficiency of the device and a decrease of maximum optical output power. Reported mechanisms for such a decrease include carrier leakage from the MQW structure to the optical confinement and cladding layers, increased optical absorption loss and recombination carrier loss at the confinement layers due to the carrier leakage and non-uniform hole injection into the MQW structure.

The graded index, separate confinement heterostructure (GRIN-SCH) is known to be effective in suppressing deterioration in low power, short cavity lasers. Continuous GRIN or multi-layer GRIN structures have been reported in order to realize low threshold current operation. For high power lasers, the reported results have shown that a two step GRIN structure has an advantage of high optical power.

SUMMARY OF THE INVENTION

It is therefore a primary object of the present invention to provide a new and improved semiconductor laser device which avoids the foregoing problems which limit high optical output operation of such a device. The laser device of the present invention is particularly useful as a pumping light source having high carrier injection efficiency for use with an optical fiber amplifier. The invention is able to achieve high carried injection efficiency without increasing the unavailable currents and is capable of enhanced optical output compared to other laser devices having an MQW structure.

To attain the foregoing object, the present invention comprises a semiconductor laser device having a cavity length of more than 800 μm with a cladding layer disposed on an optical confinement layer which is in contact with an MQW active layer having multiple well layers and multiple barrier layers, wherein an impurity is doped into at least one well layer within the active layer and at least one barrier layer adjacent to the well layer and wherein the thickness of the optical confinement layer falls within a range of from 20 to 50 nm.

The present invention also provides an optical fiber amplifier pumping device comprising the above semiconductor laser device mounted within a package containing a cooling unit, an optical lens and a photo-detector, wherein an optical fiber is coupled to the optical output facet of the semiconductor laser device.

BRIEF DESCRIPTION OF THE DRAWINGS

FIG. 4A is a cross-sectional schematic diagram of another exemplary laser module of the present invention.

DETAILED DESCRIPTION

In one aspect, the present invention is directed to a laser structure (also referred to as a laser device) having the capacity to produce a high powered optical output.

Figure 1A:
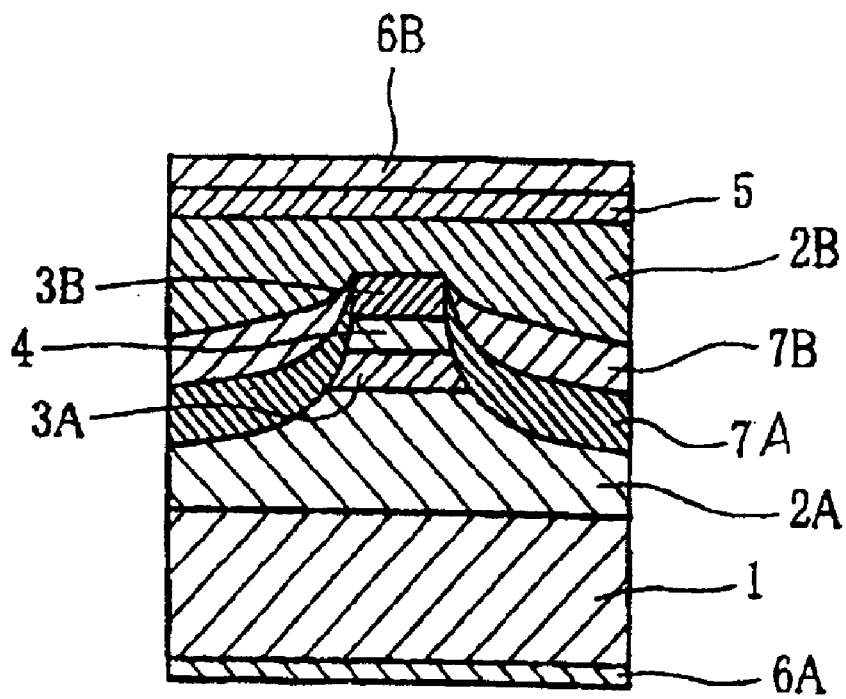
FIG. 1a is a cross-sectional view of a semiconductor laser device.

The laser device of the present invention preferably has the layer structure depicted in the exemplary cross-sectional schematic diagram of FIG. 1a, which has been previously described. Multiple quantum well (MQW) structure of active layer 4 of the present invention (not depicted in FIG. 1) is sandwiched between adjacent optical confinement layers 3A and 3B. In connection with the desire to produce a high output laser, the present invention is particularly useful with laser devices, of the type depicted in FIG. 1, having a cavity length (L) of 800 μm or greater.

A proposed approach to attaining higher optical output from a semiconductor laser device having an MQW active layer is to employ undoped well layers sandwiched between barrier layers having an n-type dopant, e.g., selenium (Se) or sulfur (S). This so-called "modulation-doping" of the barrier layer suppresses internal absorption by of the MQW structure thereby enabling higher optical output operation. However, when using MOCVD, it is very difficult to fabricate this type of modulation-doped structure within the active layer, because of the need for selective doping of an n-type dopant into only the barrier layer. For example, in cases where the n-type dopant is sulfur, the sulfur will diffuse from the barrier layers into the adjacent well layers at the temperatures used during device fabrication. Likewise, when using selenium, the well-known memory effect causes selenium to be incorporated into the well layers during the growth process. While a complete interruption of crystal growth process can be used to realize the intended abrupt doping profile with Se, such interruptions can cause abrupt, degraded interfaces between well layers and the adjacent barrier layers, increasing non-radiative recombination centers and, thereby, limiting the optical output of the device.

Figure 2:
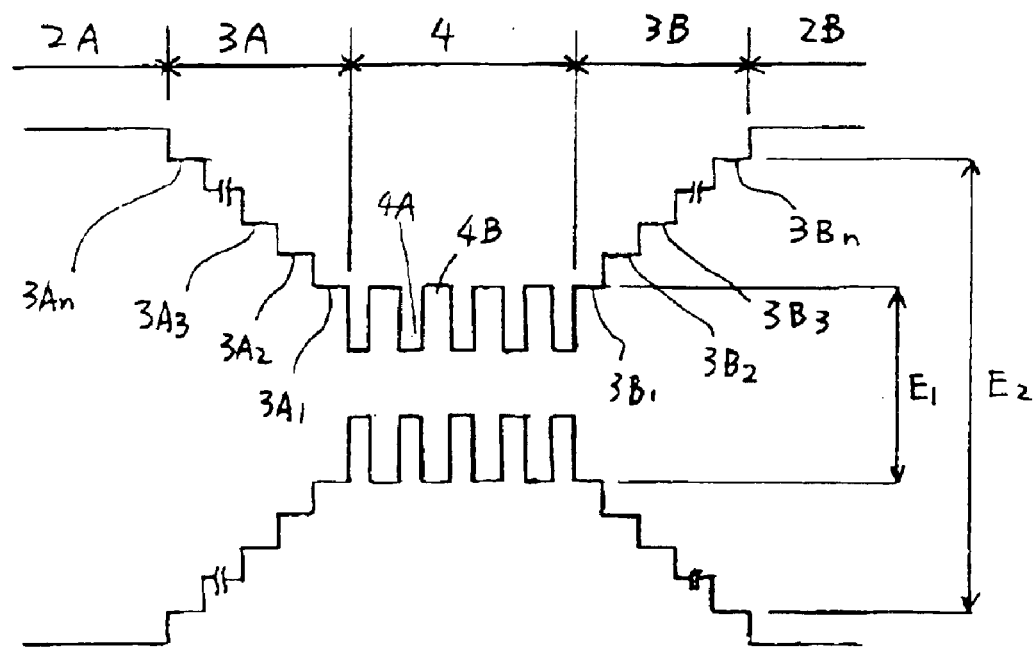
FIG. 2 is an energy band diagram showing the band gap energies of the MQW active layers and the adjacent optical confinement and cladding layers in a laser structure according to one embodiment of the present invention.

An exemplary energy band diagram of the conduction and valence bands of a laser device of the present invention is shown in FIG. 2. FIG. 2 shows the band gap between the conduction and valence bands, depicting a lower optical confinement layer 3A, an active layer 4, an upper optical confinement layer 3B and an upper cladding layer 2B which have been formed on lower cladding layer 2A in that order. As depicted in FIG. 2, active layer 4 comprises alternate heterojunctions of well layers 4A and barrier layers 4B, thereby providing an MQW structure having five wells. Optical confinement layers 3A and 3B, positioned between active layer 4 and cladding layers 2A, 2B are preferably formed in such a manner that their respective composition and thickness are symmetrical about active layer 4. Each of the optical confinement layers 3A, 3B has a plurality of steps in their respective energy bands, as shown in FIG. 2. Thus, in the embodiment of FIG. 2, optical confinement layer 3B has two sublayers $3B_1$ and $3B_2$. In order to achieve the preferred symmetrical construction of the device, optical confinement layer 3A has two corresponding sublayers, $3A_1$ and $3A_2$.

As depicted in FIG. 2, the band gap is smallest in the wells of the MQW structure of active layer 4, is greater at the barrier layers in the MQW, is still greater in the optical confinement layers, and is greatest at the cladding layers.

A first principal feature of the laser device of the present invention is that a dopant is incorporated into at least one well layer 4A of the active layer 4 and its adjacent barrier layer 4B to thereby form a doped region 8. Although FIG. 2 depicts doped region 8 as having only a one barrier layer and one well, according to the present invention doped region 8 may extend to any number of pairs of well layers and barrier layers. Indeed, according to the present invention the entire active layer may be included in doped region 8. The inventors have determined that extending the doped region to the entire active layer 4 reduces the series resistance and thermal impedance of the laser device. Reduction of the series resistance and thermal impedance reduce heat generation, permitting increased maximum optical output.

The dopant used to form doped region 8 is preferably an n-type impurity, such as S, Se and Si (silicon) or combinations thereof Preferably the doping concentration is set within a range of about from $1\times10^{17}$ to $3\times10^{18}$ cm$^{-3}$. The inventors have found that if the doping concentration is below about $1\times10^{17}$ cm$^{-3}$ then the aforementioned benefits of creating doped region 8 in active layer 4 are not obtained, such that the intended enhancement in optical output is not realized. On the other hand, the inventors have found that if the dopant concentration is above about $3\times10^{18}$ cm$^{-3}$ then the crystallinity of active layer 4 can be degraded causing non-radiative components to likewise increase. This limits high power operation of the resulting laser device.

Although an n-type dopant is preferred, the dopant used in the present invention may alternatively be a p-type dopant. The p-type impurity in such case may be any one of beryllium, magnesium or zinc or combinations thereof.

Another important feature of the laser device of this invention is that the two optical confinement layers 3A, 3B shown in FIG. 2 are specifically arranged so that the thickness of each is set to fall within a range of 20 to 50 nm. If the thickness of optical confinement layers 3B, 3A is reduced to less than 20 nm then resultant optical output can reach saturation at a lower driving current due to overflow of electrons. On the other hand, if the thickness of optical confinement layers 3B, 3A is increased above 50 nm or greater then the resulting DC resistance of the laser device increases. This causes increased heat generation which, in turn, causes optical output saturation due to thermal saturation.

Optical confinement layers 3B, 3A form heterojunctions with active layer 4. Similarly, the optical confinement layers also form heterojunctions with upper and lower cladding layers 2B and 2A. The band gap energy of cladding layers 2B and 2A is greater than the band gap energy of active layer 4. Preferably, the difference between the minimum band gap energy $E_1$ of optical confinement layers 3B, 3A and the maximum band gap energy $E_2$ of optical confinement layer is about 90 meV or more, as shown in FIG. 2.

Figure 3A:
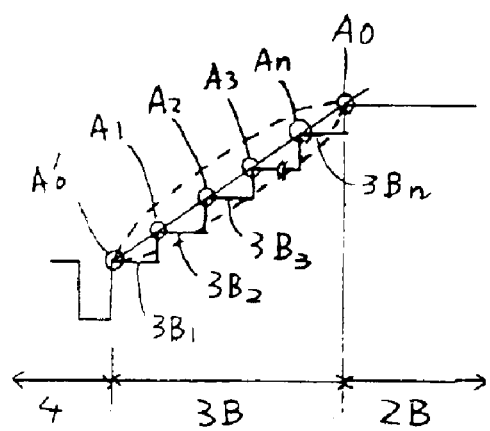
FIG. 3a is an energy band diagram showing the band gap energies for the layers between a cladding layer and an active layer in accordance with an embodiment of the present invention.

As shown in FIG. 2, optical confinement layers 3A and 3B preferably comprise three or more sublayers, for example, sublayers 3B1, 3B2, . . . , 3Bn and 3A1, 3A2, . . . , 3An. According to the present invention, the band gap energies of these respective sublayers increase in stepwise fashion as the distance from active layer 4 increases, as shown in FIGS. 2 and 3. FIG. 3 shows a series of points, A1, A2, . . . , An, A0 at the edges of the steps in the band gap of optical confinement layer 3B formed by the sublayers 3B1, 3B2, . . . , 3Bn. Note that the point A0 is formed at the step between optical confinement sublayer 3Bn and the adjacent cladding layer 2B. Also depicted in FIG. 3 is the point A0' which is located at the step in band gap energy between layer 3B1 and the adjacent active layer 4. The points A0', A1, A2, . . . , An, and A0 define an envelope line of the band gap energies of the layers, (this envelope line will be referred to hereafter as the band gap energy line). Preferably, this band gap energy line is a straight or has a continuous upward or downward convex shape as shown by broken lines in FIG. 3. The upward or downward convex shape may be, for example, parabolic.

Thus, in the case of FIG. 3, the band gap energy line intersects the band gap energy of layer 3Bn at a point An, such that the band gap energy line has a straight line shape as a whole. In this case, optical confinement layer 3B is said to have a linear GRIN-SCH structure.

As previously noted, optical confinement layers 3A and 3B are not limited only to the exemplary three-layer structure. Increasing the number of sublayers is preferred. However, increasing the number of layers requires careful control of composition of each layer—if even one of them departs from the specified lattice matching conditions then crystal degradation can occur, which may degrade laser performance due to crystal defects.

Preferably the laser device of the present invention is formed such that each of its well layers 4A has a compressive strain of between about 0.5% to about 1.5% with respect to the substrate 1. In addition, the laser device of the present invention is preferably formed such that each of its barrier layer 4B has tensile strain in order to compensate for the compressive strain in the well layers 4A. More preferably the laser device of the present invention is formed such that each of its barrier layers 4B has tensile strain in order to compensate for the compressive strain of over 1.5% in the well layers 4A.

As noted above, it is preferred that the laser device of the present invention have cavity length (L) of about 800 $\mu$m or more. More preferably, L is greater than about 1000 $\mu$m. When the cavity length is less than about 800 $\mu$m the laser device has greater electrical resistance and thermal-impedance, lowering the saturation current. This is because thermal saturation dominates the saturation current. Thus, when the cavity length is less than about 800 $\mu$m, the benefits of the present invention are not fully realized. When using a relatively long cavity, i.e., a cavity length of about 800 $\mu$m or more, it is preferable that reflectivity of the front facet of the laser device be about 5% or less and that the reflectivity of the rear facet be about 90% or greater. Applying an anti-reflective coating on the front facet of the laser device compensates for the decrease in external quantum efficiency which would otherwise occur due to reduced ratio of mirror loss against total losses caused by the use of an elongated cavity. For lasers devices have a cavity length of 1000 $\mu$m or more, it is preferred that the antireflective coating have a reflectance of around 1.5%.

Next, an exemplary laser component of the present invention is described with reference to FIG. 4. The laser component 40 has a laser device 41 sealed within a package 10. Laser device 41 is mounted on a cooling device 9 comprising a plurality of Peltier elements 9a. A collimator lens 11a is disposed adjacent to the output facet of the laser device 41 and a light collection or focusing lens 11b is positioned near a wall of package 10. An optical fiber 12 is positioned at the front of the package 10 adjacent to lens 11b, such that the light emitted by laser device 41 is optically coupled to fiber 12. A photodiode 13 is disposed adjacent to the rear facet of the laser device 41 to monitor the optical output from the device.

Preferabley, optical fiber 12 has an optical fiber grating 12b formed in its central core 12a. Preferably, the reflection bandwidth of fiber grating 12b is set at about 3 nm or less. (The reflection band width is defined as full width of half maximum (FWHM) of the reflection spectrum of fiber grating 1b.) More preferabley, the reflection bandwidth of the fiber frating is set about 2 nm or less, and even more preferably it is set at about 1.5 nm or less. However, the reflection band width of fiber grating 12b should be greater than the wavelength separtation of the longitudinal modes in the light from the laser device 41. Setting the grating bandwidth in this manner reduces or eliminates kinks in the current versus optical output characteristics of laser light from the optical fiber 12, while simultaneously narrowing the spectrum width of the light to enable enhanced multiplexing. The inventive laser module of FIG. 4 realizes a higher output power and provides more stable operation than know laser modules.

Figure 4:
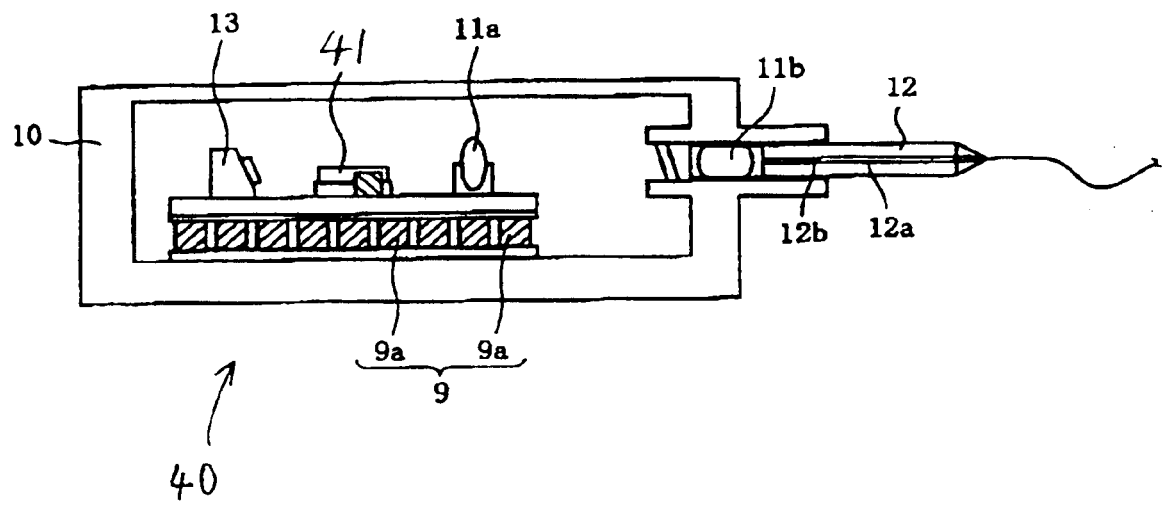
FIG. 4 is a cross-sectional schematic diagram of an exemplary laser module of the present invention.

FIG. 4A is a cross-sectional schematic diagram of another examplary laser module 40' of the present invention. Module 40' is similar to module 40 shown in FIG. 4 but depicts an embodiment which includes an isolator 14. The common elements of modules 40 and 40' are shown with like reference numbers.

EXAMPLE

Figure 1B:
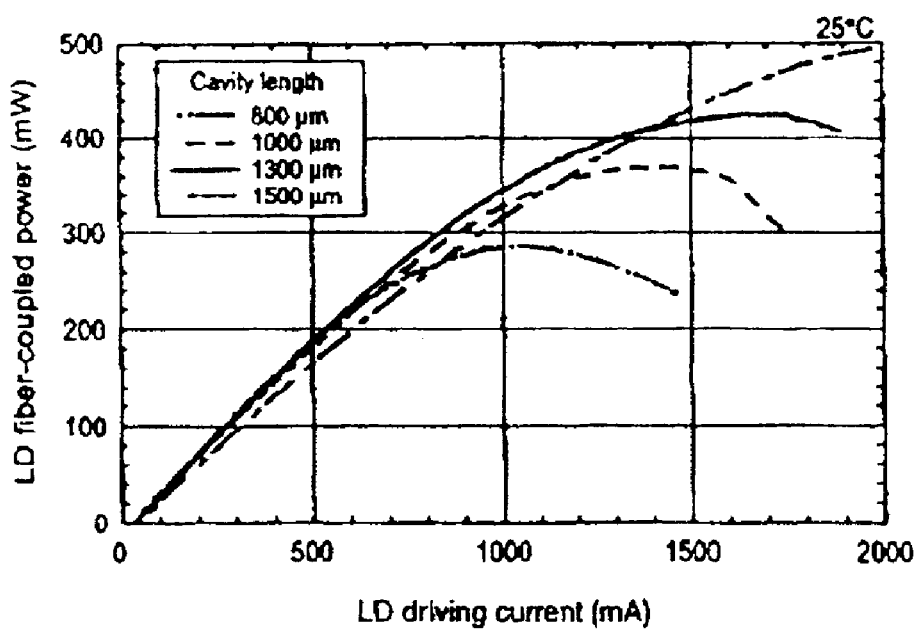
FIG. 1b is a graph showing optical output power as a function of driving current and cavity length of prior art devices.

A plurality of semiconductor laser devices according to the present invention having wavelength of 1480 nm and the layer structure shown in FIG. 1 were fabricated in the following manner, and the relation of the parameters versus laser characteristics were analyzed while changing various parameters of the devices which were constructed.

Figure 3B:
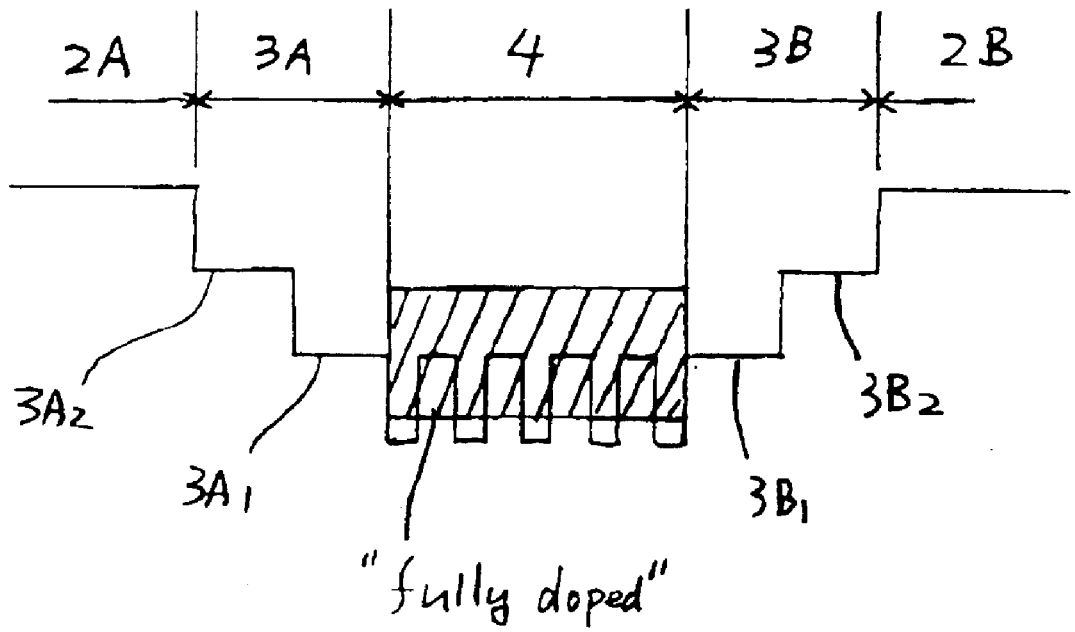
FIG. 3b is a energy band diagram showing the band gap energies for the layers in a laser device of the present invention situated between the cladding layers, depicting "fully doped" active layer in accordance with one embodiment of the present invention.

Investigation of Impurity Doping into Active Layer n n-type cladding layer 2A comprised of n-type InP was fabricated on the (100) plane of a substrate 1 made of n-type InP. A lower optical confinement layer 3A was formed on this lower cladding layer 2A, as shown in FIG. 3b. The optical confinement layer 3A was made of undoped InGaAsP-based semiconductor material with a GRIN-SCH structure as follows: a first layer 3A2, λg=1.1 μm, thickness 20 nm; and a second layer 3A1, λg=1.2 μm, thickness 20 nm were formed. An active layer 4, described in detail below, was then formed on this lower optical confinement layer 3A. Next an upper optical confinement layer 3B of InGaAsP was formed thereon, comprising a first layer 3B1, λg=1.2 μm, thickness 20 nm, and a second layer 3B2, λg=1.1 μm, thickness 20 nm. Thus, the upper and lower optical confinement layers 3A, 3B were made to be symmetrical about active layer 4.

An MQW active layer 4 was formed with five wells 4A made of InGaAsP each having a thickness of 4 nm. Each of the well layers was surrounded by a barrier layer 4B made of InGaAsP (λg=1.2 μm) with a thickness of 10 nm. The MQW active layer structure was formed to have a compressive strain of 1% in each well. An n-type dopant Se was incorporated into the layers of the MQW active layer to form an impurity-doped region 8 as follows: A first set of devices was created having doping in all of the MQW layers (referred to as the "fully doped" herein—shown in FIG. 3b) with a dopant concentration of $5\times10^{17}$ cm$^{-3}$ in all of the well layers 4A and barrier layers 4B. A second set of devices was created with doping only in a pair consisting of a centrally located well layer 4A and an adjacent barrier layer 4B (referred to hereinafter as "centrally doped"—shown in FIG. 3c) with a dopant concentration of $5\times10^{17}$ cm$^{-3}$. In addition, a set of devices was created having an undoped active layer 4 as a comparative example (referred to as "undoped" hereinafter).

Thereafter, a mesa structure was formed on each of the devices using standard photolithographic and etching techniques and a p-type current blocking layer 7A and n-type current blocking layer 7B for current constriction were formed in the area adjacent to the resulting mesas. An upper cladding layer 2B made of p-type InP was then formed on the upper optical confinement layer 3B, and a contact layer 5 made of p-type InGaAs was formed thereon. A p-type upper electrode 6B was then formed on contact layer 5 and the back surface of substrate 1 was polished. An n-type electrode 6A the formed on the resulting polished surface.

The resulting structures were then cleaved to set the cavity length (L) at 1000 μm, and an anti-reflective coating (reflectivity of 1%) was formed on the front facet S1 and a highly reflective coating (reflectivity of 95%) was formed on the rear facet S2 to complete the fabrication of the laser devices.

Figure 3C:
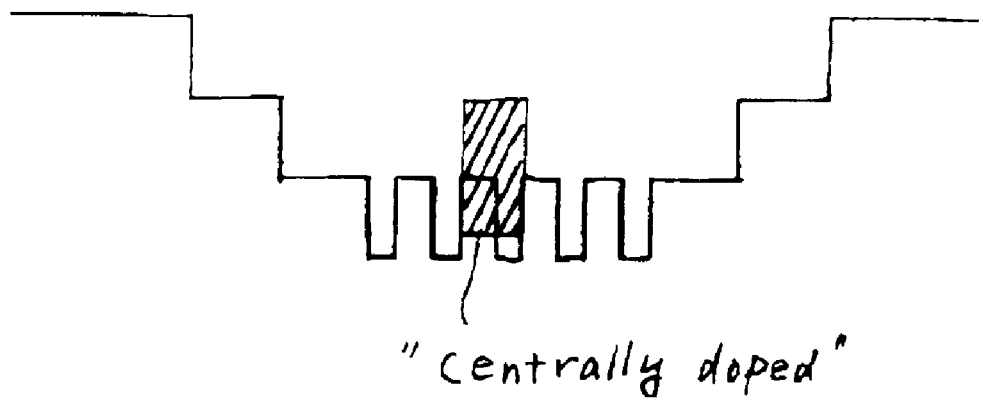
FIG. 3c is a energy band diagram showing the band gap energies for the layers in a laser device of the present invention situated between the cladding layers, depicting a "centrally doped" active layer in accordance with one embodiment of the present invention.

With regard to the laser devices of three different types, the maximum optical output (Pmax) during current driving was measured and the results are shown in FIGS. 3b and 3c. Results thus obtained are also set out in Table 1 below.

TABLE 1

| Impurity Doped Region at Active Layer | Pmax (Relative Value) |
| --- | --- |
| Fully Doped | 1.2 |
| Centrally Doped | 1.07 |
| Undoped | 1.0 |

Table 1 compares the maximum optical output power Pmax for three types of LDs with different doping conditions and with cavity length 1000 um. From Table 1 it can be seen that if all of the well layers and barrier layers of the active layer are doped, high optical output operation is achieved.

Next, for fully doped devices, the relationship between Pmax and the level of n-type (Se) doping concentration was investigated. The laser devices used for this investigation had the same in structure as described above, except that their cavity length (L) was set at 1300 μm. The results are shown in FIG. 5.

Figure 5:
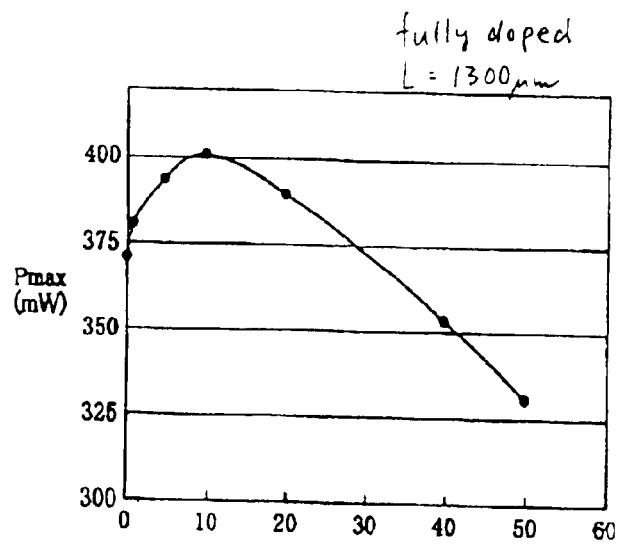
FIG. 5 is a graph showing maximum laser optical output power ($P_{max}$) as a function of the selenium doping concentration in the active MQW layer of the present invention for a "fully doped" laser device having a cavity length of 1300 μm.

As shown in FIG. 5, the value of Pmax reaches a distinct maxima which, for the devices investigated is about 400 mW when the Se doping concentration is set at $1\times10^{18}$ cm$^{-3}$. At lower or higher dopant concentrations, the effect of doping comparatively decreases. Thus, according to the present invention the optimized value of doping concentration in the active layer is set to maximize the value of Pmax.

Investigation of Thickness of GRIN-SCH Structure

Laser devices were then fabricated in the same manner as has been discussed previously except that the GRIN-SCH structure of their optical confinement layers were varied to investigate how differences in thickness affected the laser output. The cavity length of the lasers used in this aspect of the investigation was set at 1300 μm. As described, the upper optical confinement layer 3B and the lower optical confinement layer 3A were comprised of a two-layer structure of having sublayers 3B1, 3B2 and 3A1, 3A2, respectively. For this portion of the investigation, the active layer of each of the devices was fully doped (Se doping concentration $1\times10^{18}$ cm$^{-3}$).

Figure 6A:
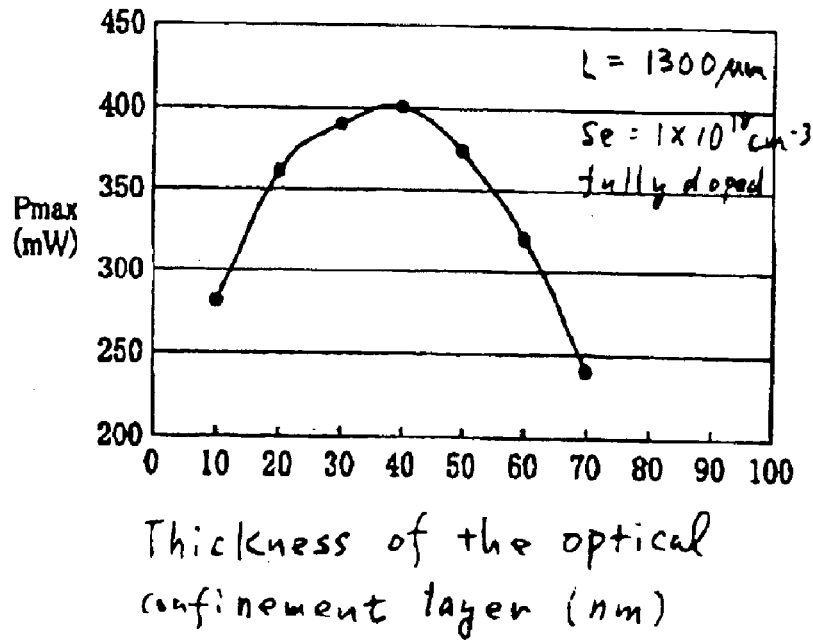
FIG. 6a is a graph showing the maximum optical output power ($P_{max}$) as a function of the thickness of the optical confinement layer in an exemplary "fully doped" laser structure of the present invention having a cavity length of 1300 μm at a doping concentration of $1 \times 10^{18}$ cm$^{-3}$.

The value of Pmax of the resulting laser devices was measured and the results are shown in FIG. 6. Again, the data show a fairly distinct maxima at around 400 mw for an optical confinement layer thickness of about 40 nm. FIG. 6 also shows that high optical output power operation of more than 360 mW was obtained when the thickness of the optical confinement layer was in the range of about 20 to 50 nm.

Figure 6B:
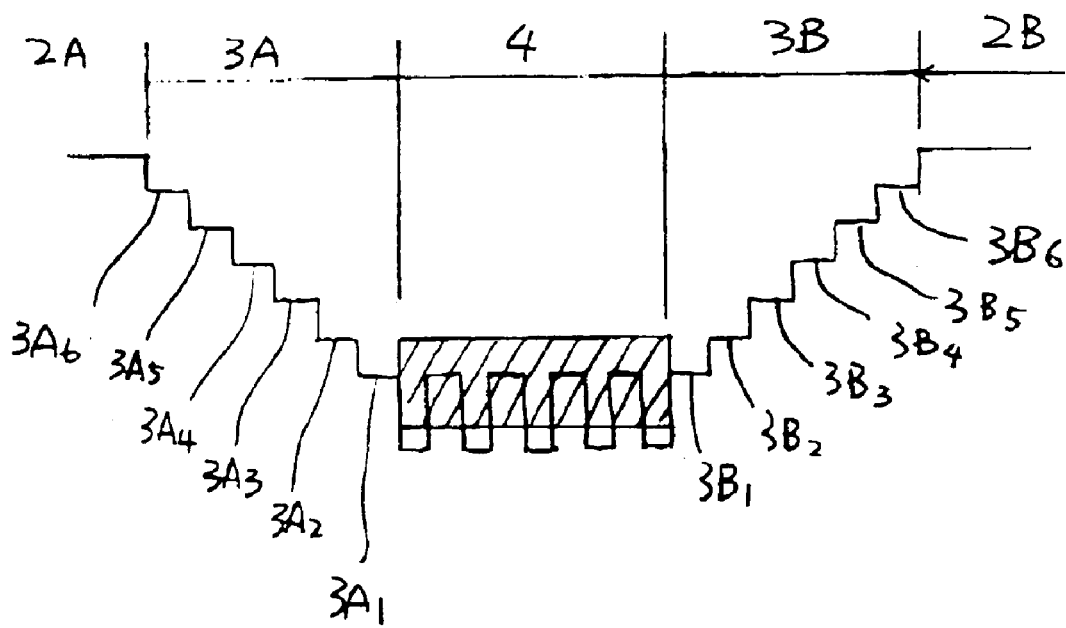
FIG. 6b is an energy band diagram showing the band gap energies of the MQW active layers and the adjacent optical confinement and cladding layers in a laser structure according to one another embodiment of the present invention having a "fully doped" active layer.

Investigation of the Relationship Between Pmax and the Number of Steps in the Optical Confinement Layer Next, for fully doped devices, the relationship between Pmax and the number of steps in the optical confinement layer was investigated. FIG. 6b shows a structure having a plurality of band-gap steps in the optical confinement layers 3A, 3B. The optical confinement layer 3A was made of undoped InGaAsP-based semiconductor material with a GRIN-SCH structure formed in the following sequence: (1) layer 3A6, λg=0.95 μm, thickness of 8 nm; (2) layer 3A5, λg=1.0 μm, thickness 7 nm; (3) layer 3A4, λg=1.05 μm, thickness 7 nm; (4) layer 3A3, λg=1.1 μm, thickness 6 nm; (5) layer 3A2, λg=1.15 μm, thickness 6 nm; and, (6) layer 3A1, λg=1.2 μm, thickness 6 nm.

An active layer 4, described below, was then formed on this lower optical confinement layer 3A.

Next an upper optical confinement layer 3B was formed thereon, consisting to the following undoped InGaAsP layers formed in sequence: (1) layer 3B1, λg=1.2 μm, thickness 6 nm; (2) layer 3B2, λg=1.15 μm, thickness 6 nm; (3) layer 3B3, λg=1.1 μm, thickness 6 nm; (4) layer 3B4, λg=1.05 μm, thickness 7 nm; (5) layer 3B5, λg=1.0 μm, thickness of 7 nm; and (6) layer 3B6, λg=0.95 μm, thickness 8 nm. Thus, the upper and lower optical confinement layers were made to be symmetrical about the active layer.

Active layer 4 was formed with five wells 4A made of InGaAsP each having a thickness of 4 nm. Each of the well layers was surrounded by a barrier layer 4B made of InGaAsP (λg=1.2 μm) with a thickness of 10 nm. The overall MQW active layer structure was formed to have a compressive strain of 1%, and was "fully doped" with a dopant concentration of $5\times10^{18}$ cm$^{-3}$ in all of the well layers 4A and barrier layers 4B.

Figure 6C:
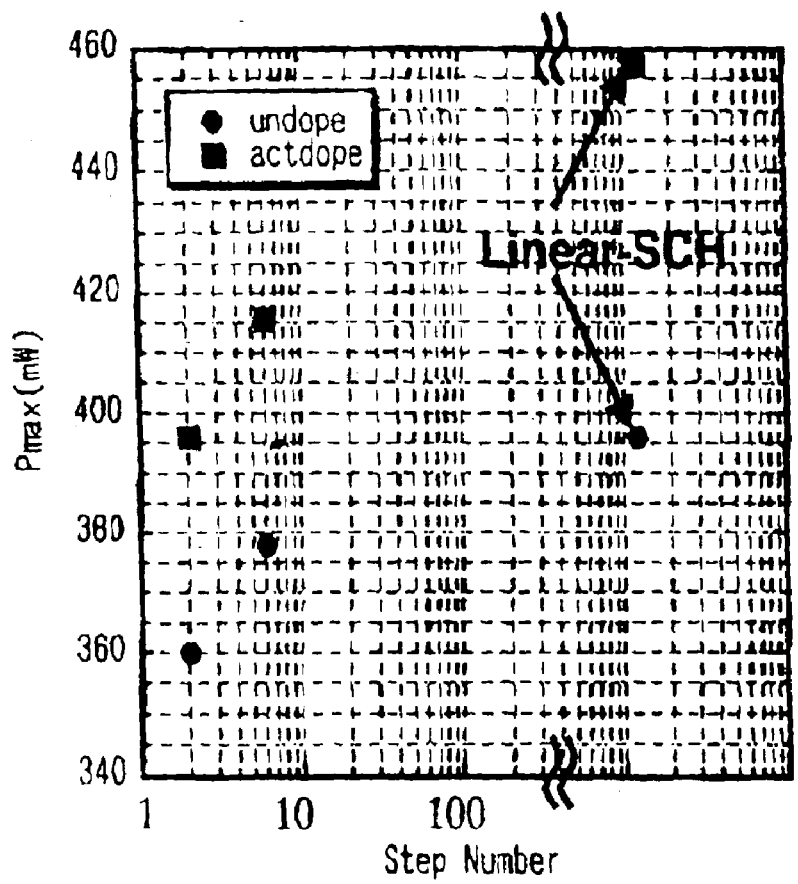
FIG. 6c is a graph showing the relationship between Pmax and the number of steps in the optical confinement layers, comparing laser structures having undoped and actively doped active layers.

The relationship between Pmax and the step number of the optical confinement structure is shown in FIG. 6c. It can be seen that Pmax increases with an increase in the number of steps in the laser device, both when the active layer is doped and when it is undoped. According to a preferred embodiment of the present invention, the optical confinement structure includes at least three steps in order to increase Pmax. The data shown in FIG. 6c was obtained by forming optical confinement layers, as above, but varying the number of steps in the layer. In each instance the total thickness of the optical confinement layers 3A, 3B was about 40 nm, and the cavity length of the laser devices investigated was varied between 600–1300 μm. FIG. 6c again shows that active doping increases the value of Pmax in comparison to an undoped devices.

Investigation of Band Gap Energy Difference Between the Outermost Optical Confinement Layer ($E_2$) and the Inner Most Optical Confinement Layer ($E_1$)

Fully doped laser devices were then fabricated with the same structure previously described, with the cavity length (L) being set at 1300 μm and with the concentration of Se doping of the active layer being set at $5\times10^{17}$ cm$^{-3}$, in order to investigate the effect of the band gap energy difference ($E_2-E_1$) between the outer most optical confinement layer and for the inner most optical confinement layer. Additionally laser devices with $E_2-E_1=0$ were also fabricated.

Figure 7:
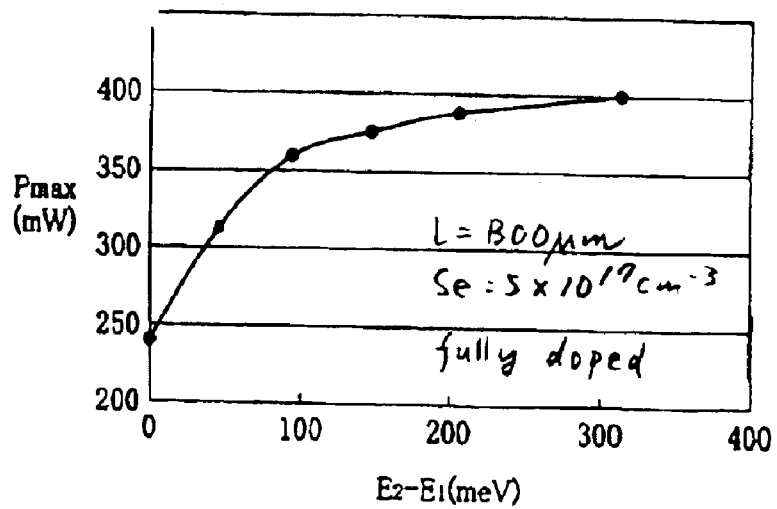
FIG. 7 is a graph showing the maximum optical output power ($P_{max}$) as a function of the energy difference between band gap energy for the outermost optical confinement layer ($E_2$) and for the inner most optical confinement layer ($E_1$) in an exemplary "fully doped" laser structure of the present invention having a cavity length of 1300 μm at a doping concentration of $1 \times 10^{17}$ cm$^{-3}$.
Figure 8:
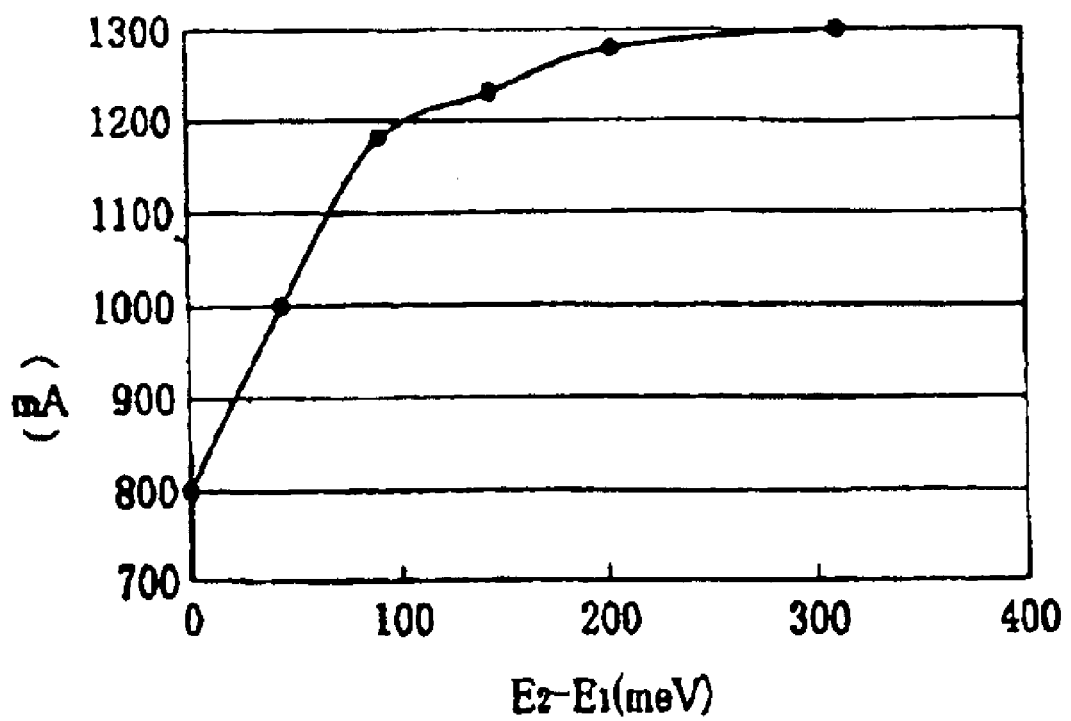
FIG. 8 is a graph showing the saturation current at which the optical output is saturated as a function of the energy difference between band gap energy for the outermost optical confinement layer ($E_2$) and for the inner most optical confinement layer ($E_1$) in an exemplary laser structure.

Pmax values of these laser devices were measured and the results are shown in FIG. 7. The optical output power versus current characteristics of the laser devices were also measured to determine the driving current at output power saturation (the saturation current), and the resultant values are shown in FIG. 8, in the form of a graph of the saturation current as a function of the value of $E_2-E_1$. FIG. 7 shows that the optical output increases with an increase in the value of $E_2-E_1$. When the value of $E_2-E_1$ is about 90 meV or more, optical output of more than 360 mW was obtained. In the devices investigated, saturation of output power occurred at about 400 mW. FIG. 8 shows that a laser device having an $E_2-E_1$ of 90 meV has a saturation output current greater than about 1200 mA, thereby enabling driving with large injection currents, which, in turn, makes it possible to attain a high maximum optical output.

Although the exemplary embodiments used laser devices of 1480 nm, it will be apparent to those skilled in the art that the present invention is not limited to such lasers. In particular, it will be appreciated that the devices of the present invention will also be particularly useful as a pumping light source for a Raman amplifier operating in the range of 1200 to 1550 nm.

Also, although the present invention has been explained with respect to an exemplary InGaAsP-based laser device on InP substrate, it will be apparent to those skilled in the art that the invention is not limited to such a structure; for example, the invention has application to an AlGaInAsP-based laser device on InP substrate and to AlGaInP or AlGaInNAsP or GaInAsP-based laser devices on GaAs substrates. Furthermore, those skilled in the art will appreciate that the substrate may be modified to p-type substrate.

The laser device of the present invention is high in carrier injection efficiency and also in optical confinement effect of optical confinement layers while offering enhanced optical output power and thus is successfully adaptable for use as a light source for pumping optical fiber amplifiers. Accordingly, the laser device of the present invention is particularly well suited for use as a light source for use in advanced systems under strict requirements of Watt-class optical output power performance, such as, for example, erbium-doped optical fiber amplifiers and/or Raman amplifiers.

While the present invention has been described in respect to particular embodiments thereof, those skilled in the art will appreciate that other changes and modifications may be made without departing from the spirit of the invention. Therefore, the invention should be construed to be limited only by the following claims.

What is claimed is:

1. A high optical output power semiconductor laser comprising:
   a multi-quantum well active layer comprising a plurality of well layers surrounded by adjacent barrier layers, at least one of said well layers and at least one adjacent barrier layer being doped with an n-type dopant in a concentration of about $1\times10^{17}$ to about $3\times10^{18}$ cm$^{-3}$,
   upper and lower optical confinement layers adjacent to said active layer, each of said optical confinement layers comprising a plurality of sublayers, such that said sublayers have a band gap energy which increases in step wise fashion from said active layer, said optical confinement layers being symmetrically disposed about said active layer and having a thickness in the range of about 20 nm to about 50 nm, upper and lower cladding layers formed adjacent to said upper and lower optical confinement layers, respectively, said upper and lower cladding layers having a band gap energy greater than the band gap energy of said adjacent optical confinement layers;

wherein said semiconductor laser has a cavity length of at least about 800 µm, and said cavity has an antireflective coating having a reflectivity of less than about 5% on an output facet thereof, and a reflective coating having a reflectivity of greater than about 90% on a rear facet thereof.

2. The semiconductor laser of claim 1 wherein the semiconductor laser emits light having a plurality of longitudinal modes.

3. A laser component incorporating the semiconductor laser of claim 1, said laser component further comprising an optical fiber having a grating formed therein; and wherein the semiconductor laser emits light having a plurality of longitudinal modes with a wavelength separation between longitudinal modes, and wherein said grating has a reflection band that is greater than the wavelength separation of the longitudinal modes.

4. The semiconductor laser of claim 1 wherein the semiconductor laser emits light having an optical power above 200 mW.

5. The semiconductor laser of claim 1, wherein said n-type dopant is selected from the group consisting of selenium, sulfur and silicon.

6. The semiconductor laser of claim 1, wherein the cavity length is greater than about 1000 um.

7. The semiconductor laser of claim 1, wherein all of the well layers and all of the barrier layers are doped.

8. The semiconductor laser of claim 1, wherein the band gap energy at the boundaries between the various adjacent layers define a band gap envelope, and wherein said band gap envelope is a straight line.

9. The semiconductor laser of claim 1, wherein the band gap energy at the boundaries between the various adjacent layers define a band gap envelope, and wherein said band gap envelope is a convex line.

10. The semiconductor laser of claim 9, wherein said convex line is substantially parabolic.

11. The semiconductor laser of claim 1, wherein the well layers have a compressive strain of between about 0.5% and 1.5%.

12. The semiconductor laser of claim 1, wherein the wavelength of the output light is in the range of about 1200 nm to about 1550 nm.

13. The semiconductor laser of claim 1, wherein the number of the plurality of sublayers in said upper and lower optical confinement layers is at least three.

14. A laser component incorporating the semiconductor laser of claim 1, said laser component further comprising at least one lens for optically coupling the output of said semiconductor laser to the facet of an optical fiber and wherein said semiconductor laser is thermally coupled to a cooling device.

15. The laser component of claim 14, wherein said optical fiber has a grating formed therein, said grating having a bandwidth of 3 nm or less.

16. The laser component of claim 14, wherein said optical fiber has a grating formed therein, said grating having a bandwidth of 2 nm or less.

17. The laser component of claim 14, wherein said optical fiber has a grating formed therein, said grating having a bandwidth of 1.5 nm or less.

18. A laser component incorporating the semiconductor laser of claim 1, said laser component further comprising an isolator, at least one lens for optically coupling the output of said semiconductor laser to the facet of an optical fiber and wherein said semiconductor laser is thermally coupled to a cooling device.

* * * * *